(12) United States Patent
Nakamura

(10) Patent No.: US 7,387,281 B2
(45) Date of Patent: Jun. 17, 2008

(54) CLAMP

(75) Inventor: Tatsuya Nakamura, Nagoya (JP)

(73) Assignee: Kitagawa Industries Co., Ltd., Nagoya-shi, Aichi-ken (JP)

( * ) Notice: Subject to any disclaimer, the term of this patent is extended or adjusted under 35 U.S.C. 154(b) by 188 days.

(21) Appl. No.: 11/411,548

(22) Filed: Apr. 26, 2006

(65) Prior Publication Data

US 2006/0243868 A1 Nov. 2, 2006

(30) Foreign Application Priority Data

Apr. 28, 2005 (JP) .............................. 2005-132121

(51) Int. Cl.
*F16L 3/00* (2006.01)

(52) U.S. Cl. ........................ 248/49; 248/65; 248/68.1; 248/71; 248/72

(58) Field of Classification Search ............... 248/49, 248/65, 68.1, 71, 72; 174/135, 650, 657, 174/663, 72 A, 68.1
See application file for complete search history.

(56) References Cited

U.S. PATENT DOCUMENTS

| 1,315,225 | A | * | 9/1919 | Hughes | 248/68.1 |
| 2,053,262 | A | * | 9/1936 | Cornell, Jr. | 248/65 |
| 2,291,148 | A | * | 7/1942 | Carson | 248/58 |
| 2,438,419 | A | * | 3/1948 | Schmidt | 174/163 F |
| 2,745,199 | A | * | 5/1956 | Kreinberg | 40/518 |
| 3,046,988 | A | * | 7/1962 | Moreau et al. | 606/196 |
| 3,324,853 | A | * | 6/1967 | Czorny et al. | 604/162 |
| 3,696,920 | A | * | 10/1972 | Lahay | 206/370 |
| 3,894,706 | A | * | 7/1975 | Mizusawa | 248/68.1 |
| 4,029,103 | A | * | 6/1977 | McConnell | 604/179 |
| 4,416,503 | A | * | 11/1983 | Hayes | 439/469 |
| 4,550,795 | A | * | 11/1985 | Teshima | 180/296 |
| 4,705,244 | A | * | 11/1987 | Saotome et al. | 248/68.1 |
| 4,775,121 | A | * | 10/1988 | Carty | 248/68.1 |
| 4,971,271 | A | * | 11/1990 | Sularz | 248/68.1 |
| 5,233,881 | A | * | 8/1993 | Sayen et al. | 74/502.4 |
| 5,721,798 | A | * | 2/1998 | Kanda et al. | 385/58 |
| 6,494,413 | B1 | * | 12/2002 | Saeki et al. | 248/68.1 |
| 6,625,372 | B1 | * | 9/2003 | Flanders et al. | 385/134 |

(Continued)

FOREIGN PATENT DOCUMENTS

JP 2001-148584 5/2001

(Continued)

*Primary Examiner*—Gwendolyn Baxter
*Assistant Examiner*—Michael McDuffie
(74) *Attorney, Agent, or Firm*—Davis Bujold & Daniels, P.L.L.C.

(57) ABSTRACT

A clamp to be surface mounted on a printed circuit board with a clamp groove into which an optical fiber is inserted. A flexible synthetic resin member is deformed by applying a pressing force so as to narrow the width of the clamp groove. The deformation causes an opening of the clamp to be closed, and opposing shape preservation members with the clamp groove located therebetween to be deformed so as to shorten the distance between top ends of the shape preservation members. A metal plate member with no spring properties remains deformed even after the pressing force is released, and the flexible synthetic resin member also remains deformed. An optical fiber pinched by inner wall surfaces of the clamp groove is unlikely to be displaced either in an axial direction or in a radial direction.

14 Claims, 12 Drawing Sheets

U.S. PATENT DOCUMENTS

| | | | |
|---|---|---|---|
| 6,758,300 B2 * | 7/2004 | Kromis et al. | 180/309 |
| 2002/0031322 A1 * | 3/2002 | Asada | 385/134 |
| 2003/0085056 A1 | 5/2003 | Goldstein et al. | |
| 2003/0086673 A1 | 5/2003 | Zah et al. | |

FOREIGN PATENT DOCUMENTS

| | | |
|---|---|---|
| JP | 2004-349413 | 12/2004 |
| WO | WO-93/16576 | 8/1993 |

\* cited by examiner

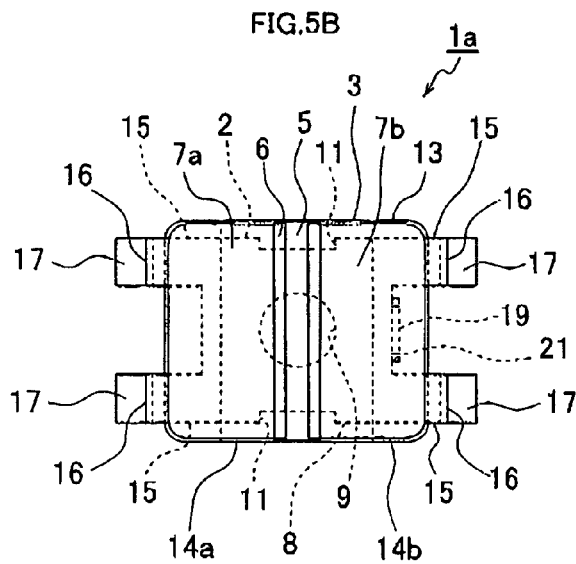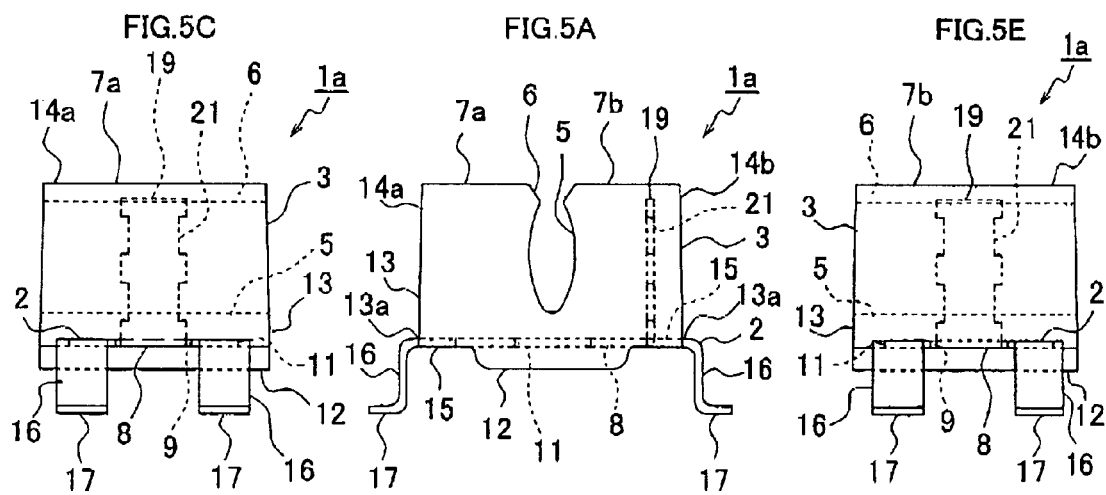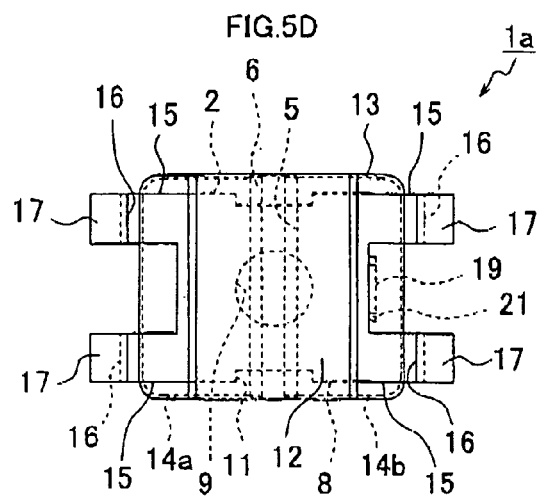

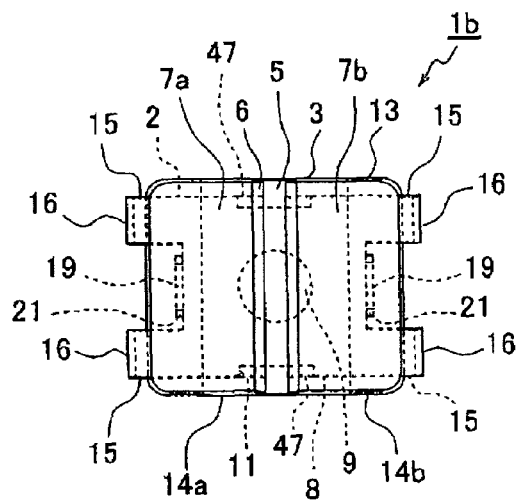
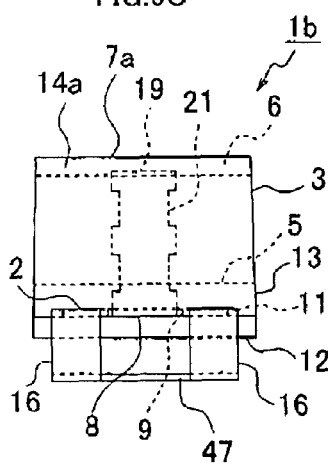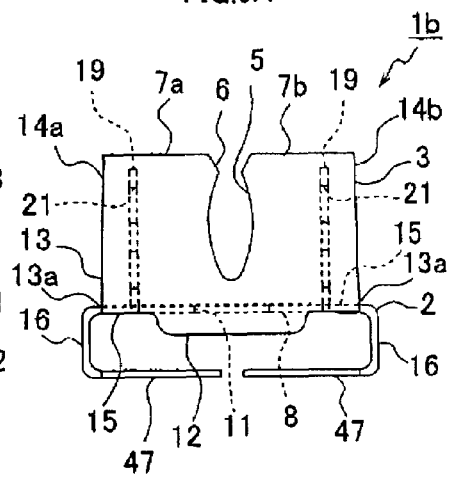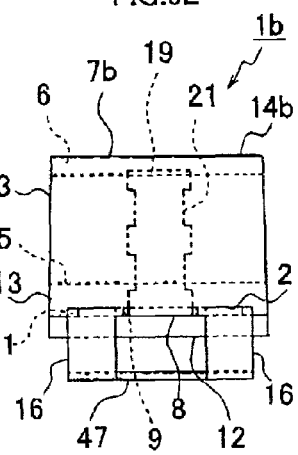
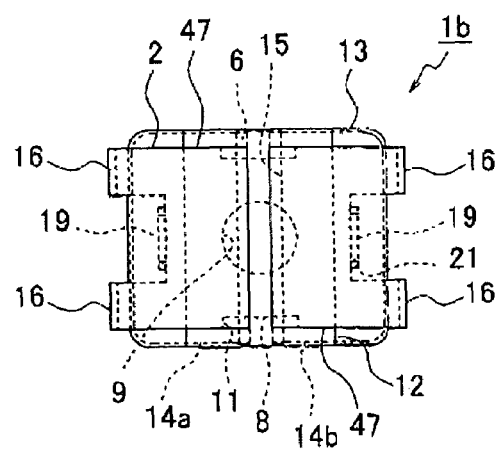

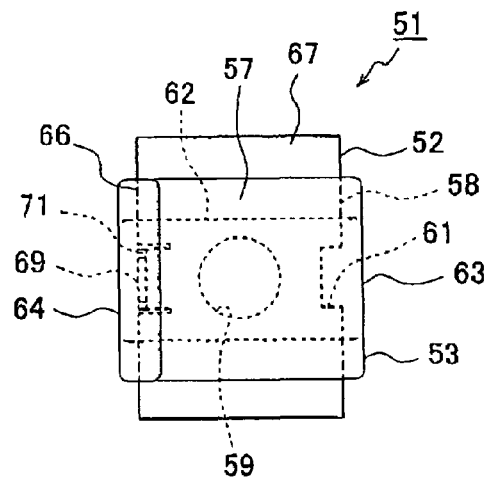
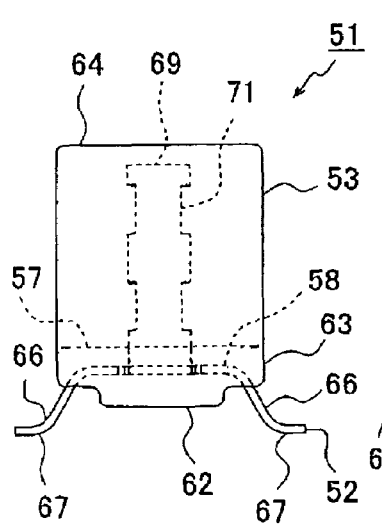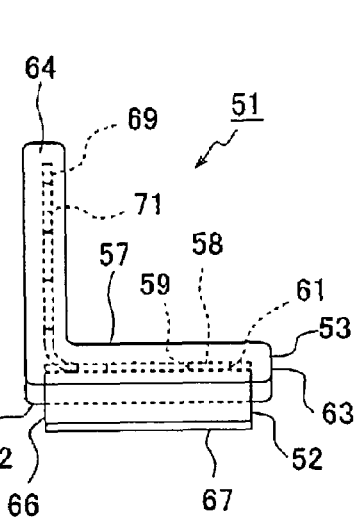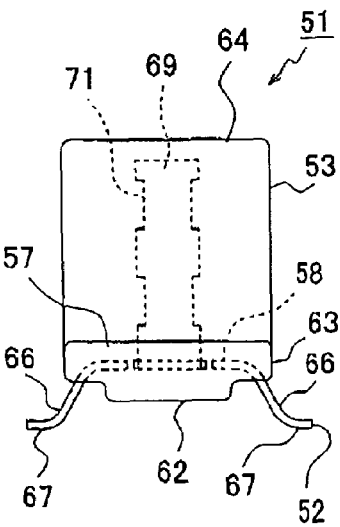
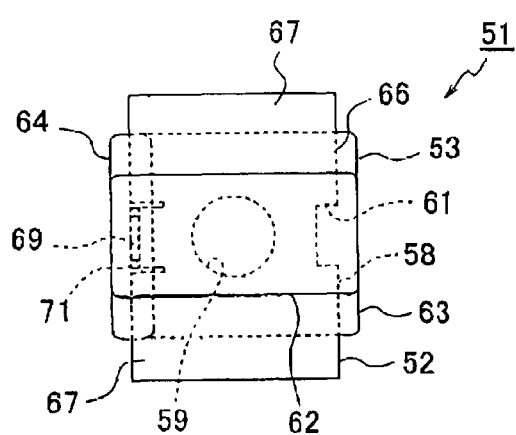

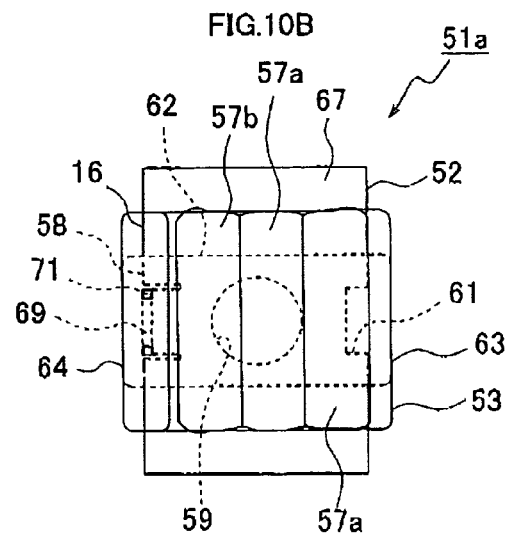
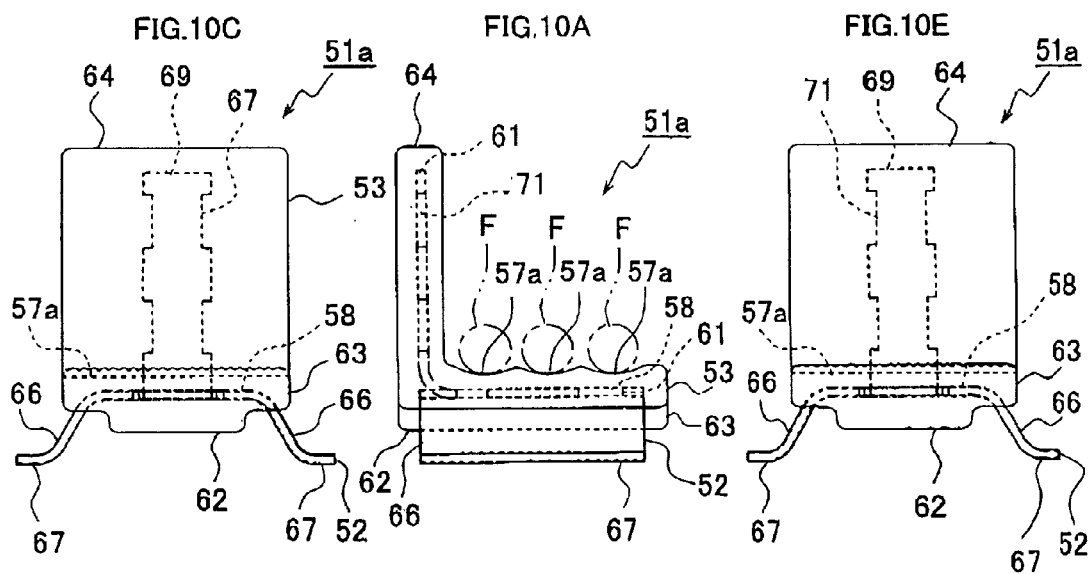
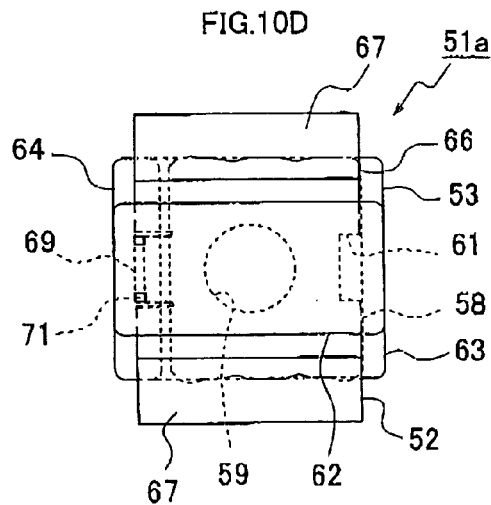

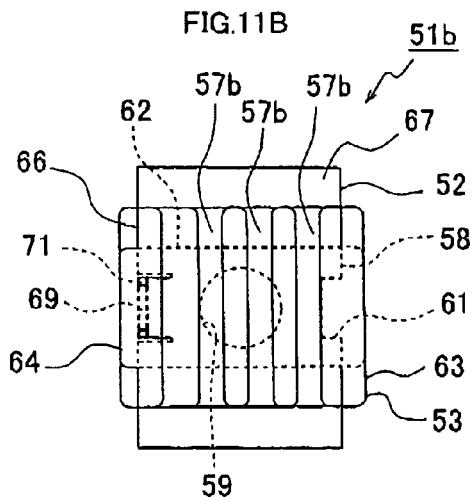
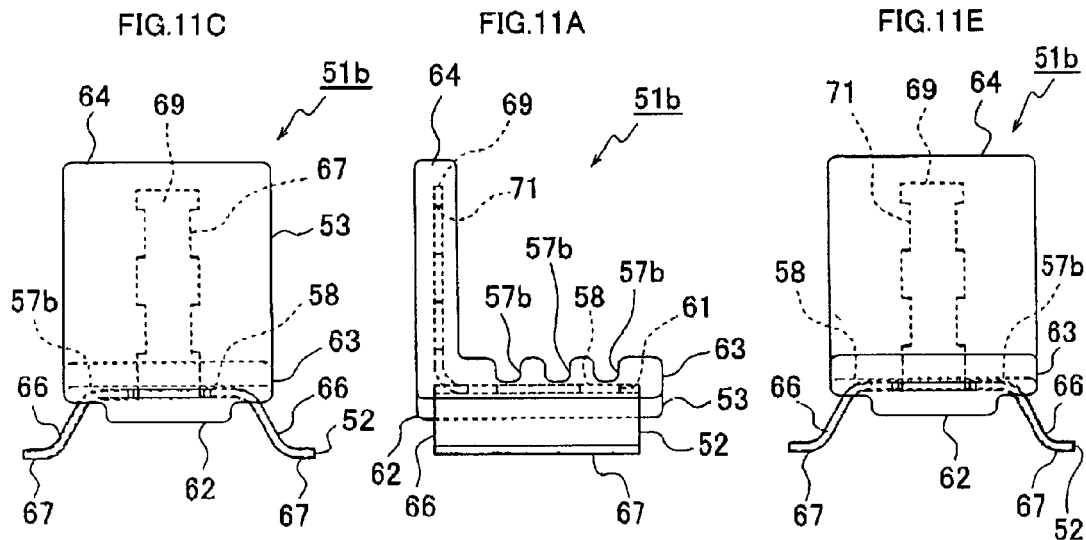
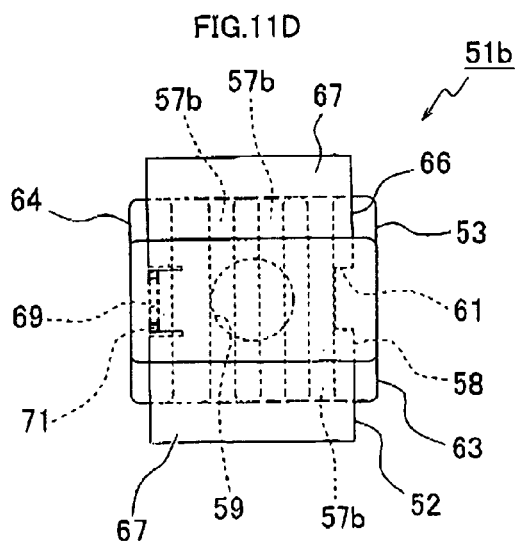

CLAMP

BACKGROUND OF THE INVENTION (i) Field of the Invention

The present invention relates to a clamp.

(ii) Background Art

When a slender member such as an optical fiber or a covered conductor is wired along a surface of a printed circuit board, a clamp for specifying a wiring path is often mounted on the printed circuit board.

One example is a metal clamp to be surface mounted on a printed circuit board disclosed in Publication of Unexamined Japanese Patent Application No. 2004-349413. Another example is a clamp formed of nylon resin or the like disclosed in Publication of Unexamined Japanese Patent Application No. 2001-148584.

SUMMARY OF THE INVENTION

A conventional metal clamp has an advantage in that the clamp can be surface mounted on a printed circuit board by automatic mounting and reflow soldering. However, when an operation to hold an optical fiber is performed or when an oscillation occurs after the optical fiber is held, for example, a covering of the optical fiber is likely to be damaged by a metal edge portion of the clamp.

On the contrary, a clamp made of synthetic resin is least likely to damage the covering. However, it is necessary, for example, to insert the clamp into the printed circuit board manually since automatic mounting is typically impossible. It is also necessary to provide a hole for fixing the clamp in the printed circuit board.

Conventional clamps have advantages and disadvantages as described above. The present invention has been made to solve these problems in conventional clamps.

In one aspect of the present invention, there is provided a clamp to be fixed to a plate member for holding a slender member. The clamp comprises a metal plate capable of bending deformation and soldering thereof and a flexible synthetic resin member held by the metal plate.

The metal plate includes a leg, a deformation allowing portion and a shape preservation member. The leg is used to attach the clamp to the plate member. The deformation allowing portion, having at least one of a through hole and a cutout, is held by the leg so as to face the plate member. The shape preservation member is erected from the deformation allowing portion on an opposite side to the leg.

The flexible synthetic resin member includes a base portion, at least one pinching portion and an excessive deformation preventing portion. The base portion covers at least a portion of one surface of the deformation allowing portion on a side of the shape preservation member. The at least one pinching portion, designed to pinch the slender member, is integrally joined to the base portion and includes at least one pinching portion with a frame encompassing a part or an entirety of the shape preservation member. The excessive deformation preventing portion is arranged opposite to the base portion with the deformation allowing portion located therebetween. The excessive deformation preventing portion connects with the base portion through the at least one of the through hole and the cutout.

When the at least one pinching portion with the frame is deformed so as to pinch the slender member between the at least one pinching portion with the frame and another one of the at least one pinching portion, or between the at least one pinching portion with the frame and a portion of the flexible synthetic resin member other than the at least one pinching portion, the shape preservation member encompassed by the at least one pinching portion with the frame is accordingly deformed.

The at least one pinching portion with the frame and the shape preservation member remain deformed, even after a force, applied to deform the at least one pinching portion with the frame, is released.

The clamp is fixed to a plate member such as a printed circuit board, in order to be used to hold a slender member, such as an optical fiber, an electrical wire, a cable, and a thin tube for example.

The clamp comprises a metal plate capable of bending deformation and soldering thereof, and a flexible synthetic resin member held by the metal plate. The metal plate is made of a metal having little or no physical properties allowing bending deformation, such as spring properties, and is capable of soldering. For example, tough pitch copper, oxygen-free copper, or brass may be employed. The flexible synthetic resin member preferably has a hardness of 90 degrees or less as measured with a Type A durometer (JIS K6253). Since the hardness of 90 degrees as measured with a Type A durometer (JIS K6253) corresponds to a hardness of 78 as measured with a Type B durometer (ASTM D2240), preferable hardness may be defined as a hardness of 78 or less as measured with a Type B durometer (ASTM D2240).

To surface mount a clamp on a printed circuit board, reflow soldering is usually performed. Therefore, the flexible synthetic resin member preferably is made of a material resistant to the heat applied during soldering. The flexible synthetic resin member may be made of rubber, thermoplastic elastomer having a rubber elasticity, or a gel having a three-dimensional net-like structure in which multiple polymer molecules partially bonded to one another due to bond of specific portions in chains, for example.

Examples of the above-mentioned rubber may be natural rubber, isoprene rubber, butadiene styrene rubber, butadiene-acrylonitrile rubber, butyl rubber, chloroprene rubber, ethylene-vinyl acetate rubber, polysulfide rubber, urethane rubber, ethylene propylene rubber, ethylene propylene terpolymer, gutta-percha, chlorosulfonated plyethylene, silicone rubber, butadiene rubber, fluorocarbon rubber, polyisobytylene, and acrylic rubber.

Examples of the above-mentioned thermoplastic elastomer may be styrene block copolymer (SBC), thermo polyolefin (TPO), thermoplastic polyurethane (TPU), and thermoplastic elastomer vulcanizates (TPV).

The above-mentioned gel is preferably in a state in which fluidity has been lost by containing a softener (e.g., an oil component) in the gaps in the net-like structure of a base polymer having a three-dimensional net-like structure.

The base polymer may be one of the thermoplastic elastomers of a styrene system, such as Styrene-Isoprene-Styrene system (SIS system), Styrene-Ethylene-Propylene-Styrene system (SEPS system), Styrene Ethylene-Butadiene-Styrene system (SEBS system), olefin system, ester system, amid system, urethane system, or the like. Modifications of these systems, for example, by addition of water may be employed. Alternatively, the base polymer may be thermoplastic resins of styrene system, ABS system, olefin system, vinyl chloride system, acrylic system, carbonate system, acetal system, nylon system, halogenated olefin system (tetrafluoroethylene system, fluorochloroethylene system, fluoroethylene propylene system, or the like), cellulose system (ethyl cellulose system, or the like), and rubber modifications of these resins. These thermoplastic resins may be used separately, or by blending two or more of them together.

The above-mentioned softener may be one of various mineral oil-based, vegetable oil-based or synthetic oil-based rubber softeners or resin softeners. Examples of mineral oil-based softeners are paraffinic, naphthenic, and aromatic process oils. Examples of vegetable oil-based softeners are castor oil, cotton seed oil, linseed oil, rapeseed oil, soybean oil, palm oil, coconut oil, arachis oil, vegetable wax, pine oil, and olive oil. These softeners may be used separately, or by blending two or more of them that have good compatibility with each other. The hardness of the gel may be appropriately adjusted on the grounds that the hardness of the gel is decreased as the added amount of a softener is increased.

Besides the base polymer and the softener, additives such as a known resin component may also be added, in order to improve various properties. Examples of the resin component include polyolefin resin and polystyrene resin. Addition of these components will lead to an improved processability or heat resistance. Examples of the polyolefin resin include: copolymers of polyethylene, isotactic polypropylene or propylene, and a small amount of $\alpha$-olefin (e.g., propylene-ethylene copolymer, propylene/4-methyl-1-pentene copolymer); poly(4-methyl-1-pentene); and polybutene-1.

Examples of the above-mentioned additives that may be used when necessary are antibacterial agents, hindered amine light stabilizers, ultraviolet absorbers, antioxidants, inorganic fillers, coloring agents, silicone oils, coumarone resins, coumarone-indene resin, phenolic terpene resins, petroleum hydrocarbons, and various tackifiers, such as rosin derivatives.

The metal plate includes a leg, a deformation allowing portion and a shape preservation member. The leg is used to attach the clamp to the plate member, such as a printed circuit board. It is, therefore, preferable that a fixing portion, which includes a flat surface facing the plate member, is integrally joined to an end of the leg.

Providing such a fixing portion results in a sufficient contact area between the fixing portion and the plate member, and thereby an increased stability when the clamp is attached to the plate member. The fixing portion may be used to attach the clamp to the plate member not only by soldering, but also by double-sided tape (pressure sensitive adhesive double coated tape) previously applied to the fixing portion.

The fixing portion is not always necessary to solder the clamp, since soldering may be performed with either the leg or the fixing portion. When the plate member is a printed circuit board, it may be possible to solder the leg or the fixing portion to an earth pattern without providing a landing for soldering the clamp to the printed circuit board.

The deformation allowing portion has at least one of a through hole and a cutout. The deformation allowing portion is held by the leg so as to face the plate member. The deformation allowing portion preferably has a flat configuration to facilitate easy processing, but may have other configurations, such as a corrugated plate. The deformation allowing portion holds a base portion of the flexible synthetic resin member that covers at least a portion of one surface of the deformation allowing portion on a side of the shape preservation member.

The excessive deformation preventing portion, which is arranged opposite to the base portion with the deformation allowing portion located therebetween, connects with the base portion through the at least one of the through hole and the cutout. The deformation allowing portion also holds the excessive deformation preventing portion.

The shape preservation member is erected from the deformation allowing portion on an opposite side to the leg. A part or an entirety of the shape preservation member is encompassed by a pinching portion with a frame among the plurality of pinching portions of the flexible synthetic resin member. In other words, the shape preservation member serves as an internal frame of the pinching portion with the frame.

The shape preservation member preferably forms, in a state before being deformed, one of substantially a right angle and an acute angle on a side of pinching the slender member, with the deformation allowing portion.

The at least one pinching portion is integrally joined to the base portion to be used to pinch the slender member. The at least one pinching portion includes at least one pinching portion with a frame described above. When the pinching portion with the frame is deformed so as to pinch the slender member at one of between the pinching portion with the frame and another one of the at least one pinching portion, and between the pinching portion with the frame and a portion of the flexible synthetic resin member other than the at least one pinching portion, the shape preservation member encompassed by the pinching portion with the frame is accordingly deformed.

The pinching portion with the frame and the shape preservation member remain deformed, even after a force applied to deform the pinching portion with the frame is released. Therefore, the slender member may be prevented from coming off the clamp due to a weakened pinch effect.

To maintain the configuration of the pinching portion with the frame to clamp the slender member after being deformed, the plate member is preferably made of a material having no spring properties. However, a material having spring properties to a slight extent may be employed as long as the material can serve the function to maintain the configuration of the pinching portion with the frame after being deformed.

To maintain the deformation of the pinching portion with the frame and the shape preservation member, even after a force applied to cause the deformation is released, the flexible synthetic resin member should not have a large repulsive force against the deformation. This is why the preferable hardness of the flexible synthetic resin member is defined as a hardness of 90 degrees or less as measured with a Type A durometer (JIS K6253), corresponding to a hardness of 78 or less as measured with a Type B durometer (ASTM D2240).

The above described gel is too soft and is out of the measuring range with a Type A durometer (JIS K6253) in most cases. It is clear that the gel has a hardness of 90 degrees or less as measured with a Type A durometer (JIS K6253). Accordingly, it is preferable to indicate the hardness of the gel using Asker-FP hardness scale measured with an analog hardness meter (ASKER-FP durometer produced by KOUBUN-SHI KEIKI CO., LTD.). In this case, the gel preferably has an Asker-FP hardness of 30 or more. This is because a gel having an Asker-FP hardness of less than 30 requires an addition of a large amount of softener, which leads to a large compression set and possible seeping of the softener.

Although the pinching portion with the frame and the shape preservation member should remain deformed even after a force applied to cause the deformation is released, a slight return from the deformation may be allowable within a range such that the pinching can be maintained.

If a pressing force to press the base portion of the flexible synthetic resin member toward the plate member is exerted during the deformation of the pinching portion with the frame, the pressing force is applied to the deformation allowing portion. In the joining area of the leg and the deformation allowing portion, the deformation allowing portion resists the pressing force by being supported by the leg. Accordingly, the central portion of the deformation allowing portion is deformed to be convex toward the plate member. The leg preferably extends so as to be substantially perpendicular to the deformation allowing portion, in order to provide sufficient support in the joining area. The leg may extend so as to form a slightly acute or obtuse angle with the deformation allowing portion, as long as the leg can still provide sufficient support.

When the excessive deformation preventing portion, which is located between the deformation allowing portion and the plate member, contacts the plate member, the excessive deformation preventing portion supports the deformation allowing portion so as not to allow a further deformation of the deformation allowing portion. That is, the excessive deformation preventing portion prevents excessive deformation of the deformation allowing portion.

According to the clamp of the present invention, a slender member such as an optical fiber is pinched by a flexible synthetic resin member. Therefore, the covering of the optical fiber is unlikely to be damaged at the time of the pinching of the optical fiber or with vibration after the optical fiber is pinched.

Since the slender member is inserted before deforming the clamp so as to pinch the slender member, a reaction force at the time of insertion is small. Accordingly an excessive force can be prevented from being exerted on the slender member during the insertion.

The configuration of pinching the slender member by the flexible synthetic resin member may be applied to slender members having various diameters. In addition, it may be possible to clamp a plurality of slender members all together. In this case, the plurality of slender members may have different diameters. In brief, a variety of objects can be clamped using the clamp of the present invention.

The clamp can be attached to the plate member by soldering the leg (for example, the fixing portion) or attaching the leg with double-sided tape to the plate member. It is, therefore, unnecessary to provide an attachment hole in the plate member.

When the leg is soldered to, for example, a printed circuit board, automatic surface mounting of the clamp may be possible by forming a surface of the flexible synthetic resin member opposite to the printed circuit board, i.e., an upper surface of the flexible synthetic resin member when the clamp is placed on a horizontal plane, into a flat surface that accommodates nozzle suction. Accordingly, the clamp does not require manual fitting onto the printed circuit board, or provision of an attachment hole in the printed circuit board.

In another aspect of the present invention, two pinching portions are located to face each other, and a clamp groove for passing the slender member therethrough is formed between the two pinching portions. After the clamp is fixed to the plate member, upper surfaces of the two pinching portions are pressed toward the base portion, the pressing force will deform the base portion such that the excessive deformation preventing portion may approach the plate member.

While the pressing force is exerted on the deformation allowing portion, the deformation allowing portion resists the pressing force by being supported by the leg in the joining area of the leg and the deformation allowing portion. Accordingly, the central portion of the deformation allowing portion is deformed to be convex toward the plate member surface. The leg preferably extends so as to be substantially perpendicular to the deformation allowing portion, in order to provide sufficient support in the joining area. The leg may extend so as to form a slightly acute or obtuse angle with the deformation allowing portion, as long as the leg can provide sufficient support.

The two pinching portions facing each other are subject to deformation to decrease the distance therebetween, thereby leaning toward each other. The deformation results in a narrowing of the width of the clamp groove, thereby pinching the slender member. The deformation of the deformation allowing portion causes the shape preservation member to follow the deformation of the pinching portions.

When a slender member, such as an optical fiber, an electrical wire, a cable or a thin tube, is inserted in the clamp groove prior to the deformation by the above-mentioned pressing force, the slender member can be pinched by the inner wall surfaces of the clamp groove with a narrowed width due to the deformation.

In the clamp of the present invention, in which at least one of the two pinching portions is a pinching portion with a frame, the pinching portion with the frame and the shape preservation member remain deformed even after the force to cause the deformation is released. The materials of the base portion and the deformation allowing portion correspond respectively to the materials of the pinching portions and the shape preservation member. Therefore, the base portion and the deformation allowing portion also remain deformed even after the force causing the deformation is released. Thus, the slender member is unlikely to come out of the clamp due to a weakened pinch effect.

The shape preservation member serves to cause the above-mentioned deformation of the pinching portion with the frame and to maintain the configuration of the pinching portion with the frame after the deformation. Therefore, the shape preservation member is preferably erected so as to form a substantially perpendicular or an acute angle with the deformation allowing portion on the side of the clamp groove before the deformation.

In a further aspect of the present invention, the deformation allowing portion is provided with an extending portion, and the leg extends from the extending portion. According to the configuration, in which the extending portion having a relatively narrow width can be deformed easily, the pressing force required to cause the deformation may be relatively small.

In the case where both of the two pinching portions are pinching portions with a frame, the above described advantages of providing two pinching portions will be improved. However, it may also be possible to employ a configuration in which only one of the two pinching portions is a pinching portion with a frame.

In a yet another aspect of the present invention, the clamp is provided with one pinching portion with a frame, and the slender member is pinched between the pinching portion with the frame and the base portion. This configuration may provide a clamp with a simplified structure.

It may be possible to vary the number of slender members capable of being pinched all together by varying the dimensions of the pinching portion with the frame and the base portion. It may also be possible to produce a clamp capable of pinching a relatively large maximum number of slender members and to use the clamp so as to pinch an appropriate number of slender members within the maximum number.

When the base portion is provided with depressions so as to stabilize the pinching positions of the slender members, displacement of the pinched slender members can be prevented. Also, a plurality of slender members can be pinched in an orderly manner.

BRIEF DESCRIPTION OF THE DRAWINGS

Preferred embodiments of the present invention will be described hereinafter with reference to the drawings, in which:

FIGS. 5A through 5E are a front elevational view, a plan view, a left side elevational view, a bottom view and a right side elevational view, respectively, showing a clamp of Embodiment 3;

FIGS. 6A through 6E are a front elevational view, a plan view, a left side elevational view, a bottom view and a right side elevational view, respectively, showing a clamp of Embodiment 4;

FIGS. 8A through 8E are a front elevational view, a plan view, a left side elevational view, a bottom view and a right side elevational view, respectively, showing a clamp of Embodiment 5;

FIGS. 10A through 10E are a front elevational view, a plan view, a left side elevational view, a bottom view and a right side elevational view, respectively, showing a clamp of Embodiment 6;

FIGS. 11A through 11E are a front elevational view, a plan view, a left side elevational view, a bottom view and a right side elevational view, respectively, showing a clamp of Embodiment 7.

DETAILED DESCRIPTION OF THE PREFERRED EMBODIMENTS

Embodiment 1

As shown in FIGS. 1A through 1C and FIG. 2, a clamp 1 of the present embodiment includes a metal plate member 2 and a flexible synthetic resin member 3.

The metal plate member 2 is produced by pressing a metal plate with little or no spring properties and capable of being soldered. A tough pitch copper plate (JIS (Japanese Industrial Standard) H3100 C1100R) having a thickness of 0.2 mm is employed in the present embodiment.

The flexible synthetic resin member 3 is formed of flexible synthetic resin. Silicone having a hardness of 40 degrees as measured with a Type A durometer (JIS K6253) is employed in the present embodiment. The hardness of 40 degrees as measured with a Type A durometer (JIS K6253) corresponds to a hardness of approximately 20-30 as measured with a Type B durometer (ASTM D2240). However, rather than being fixed the correspondence between the two types of hardness is variable depending on various conditions, such as the composition of a sample, vulcanizing conditions, the resulting viscoelasticity, the dimension, the shape, the temperature during measurement. Therefore, the degree of hardness should be used only as an indication for comparison purposes.

The flexible synthetic resin member 3 has a substantially square column shape, although the side faces are slightly tapered. The flexible synthetic resin member 3 is provided with a clamp groove 5 in a central portion thereof.

Figure 1A:
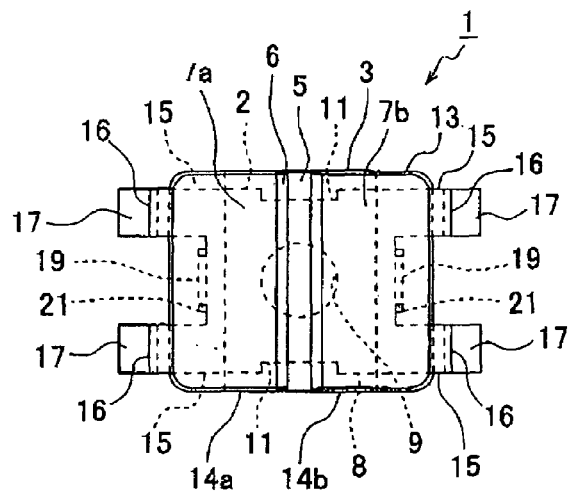
FIGS. 1A, 1B and 1C are a plan view, a front elevational view and a right side elevational view, respectively, showing a clamp of Embodiment 1.
Figure 1B:
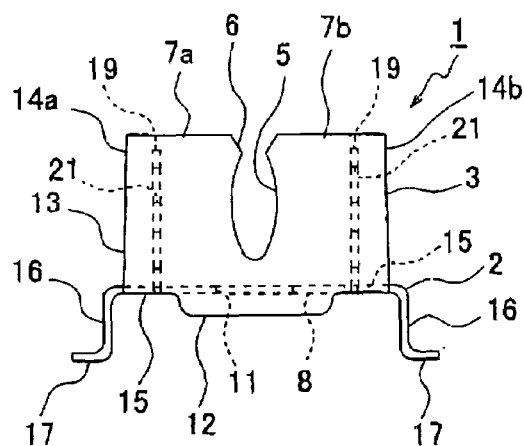
Figure 1C:
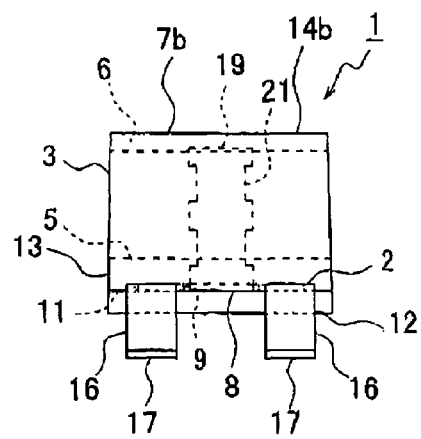
Figure 2:
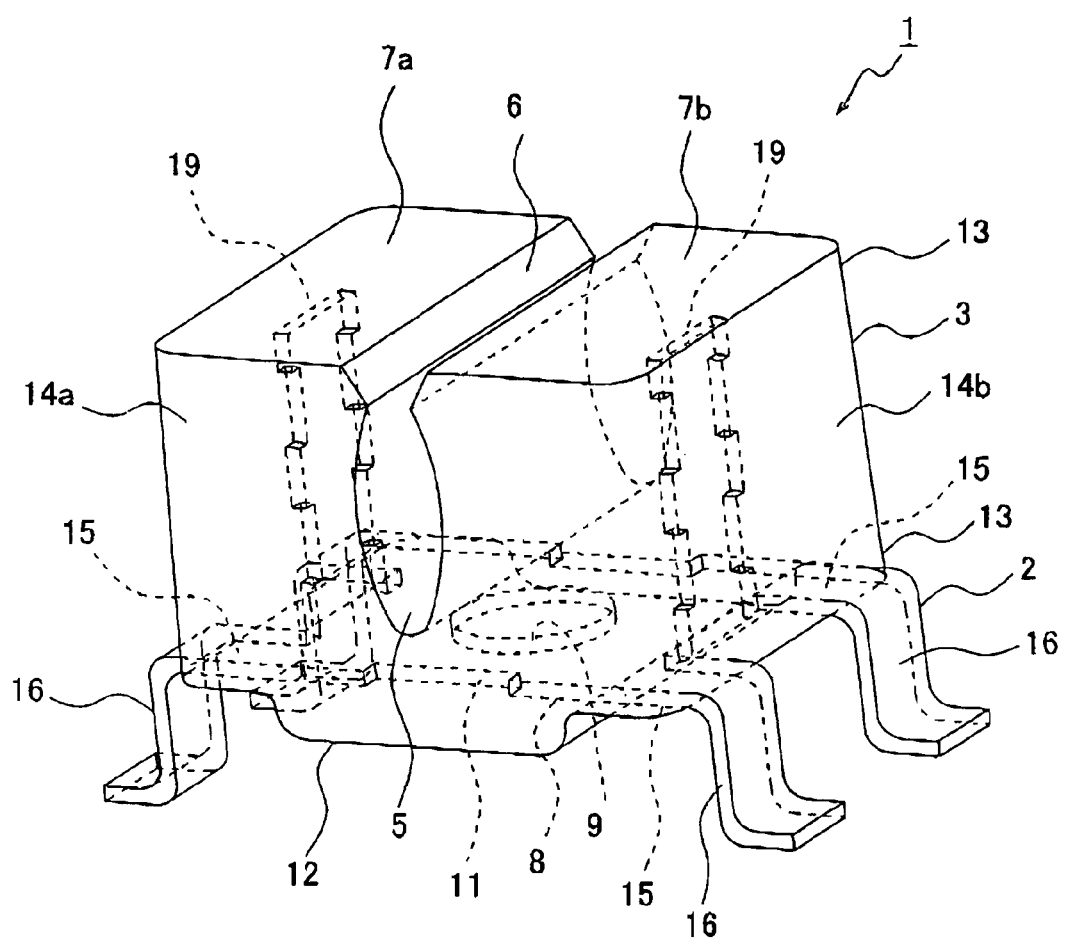
FIG. 2 is a perspective view showing the clamp of Embodiment 1.

As clearly shown in FIGS. 1A and 2, the clamp groove 5 is provided between two opposite side faces of and across the flexible synthetic resin member 3. An opening 6 of the clamp groove 5 divides an upper face of the flexible synthetic resin member 3 into two upper surfaces 7a and 7b, and pinching portions 14a and 14b are formed on both sides of the clamp groove 5. The opening 6 includes a slant configuration such that a later-described slender member, such as an optical fiber, can easily be inserted into the clamp groove 5 and will not easily come out of the clamp groove 5 once inserted.

The pinching portions 14a and 14b facing each other across the clamp groove 5 have proximal portions that are integrally joined to a base portion 13 that is joined to an upper surface side of a deformation allowing portion 8 of the metal plate member 2.

The flexible synthetic resin member 3 spreads to an under surface of the deformation allowing portion 8 through a through hole 9 and cutouts 11 provided in the deformation allowing portion 8. An excessive deformation preventing portion 12 is formed on an under surface side of the deformation allowing portion 8.

That is, the flexible synthetic resin member 3 includes the excessive deformation preventing portion 12 joined to the under surface side of the deformation allowing portion 8, the base portion 13 joined to the upper surface side of the deformation allowing portion 8, and a pair of the pinching portions 14a and 14b facing each other across the clamp groove 5 and being integrally joined to an upper portion of the base portion 13. The flexible synthetic resin member 3 is continuous on both the upper surface side and the under surface side of the deformation allowing portion 8 through the through hole 9 and the cutouts 11. The upper surfaces 7a and 7b of the flexible synthetic resin member 3 are substantially parallel with the upper surface of the deformation allowing portion 8.

The deformation allowing portion 8 of the metal plate member 2 is provided with four extending portions 15, at two sets of opposite positions across the clamp groove 5 located therebetween. Legs 16 extend from the respective extending portions 15. Fixing portions 17, integrally joined to the respective legs 16, are used for attachment of the clamp 1 to a plate member, such as a printed circuit board.

The deformation allowing portion 8 and the extending portions 15 substantially constitute a continuous flat plate, while the legs 16 are bent to be substantially perpendicular to the extending portions 15. The fixing portions 17 are bent to be substantially perpendicular to the legs 16.

A pair of shape preservation members 19 are erected from the deformation allowing portion 8. The shape preservation members 19 are arranged to face each other across the clamp groove 5 located therebetween. Each of the shape preservation members 19 is formed such that a portion is cut between two of the extending portions 15 and bent to be erected substantially perpendicular to the deformation allowing portion 8.

The shape preservation members 19 are entirely covered by the base portion 13 and the pinching portions 14a and 14b of the flexible synthetic resin member 3. In other words, each of the pinching portions 14a and 14b is a pinching portion including a frame. Longitudinal sides of each of the shape preservation members 19 are provided with cutouts 21, thereby having concaves and convexes that engage the flexible synthetic resin member 3.

Figure 3A:
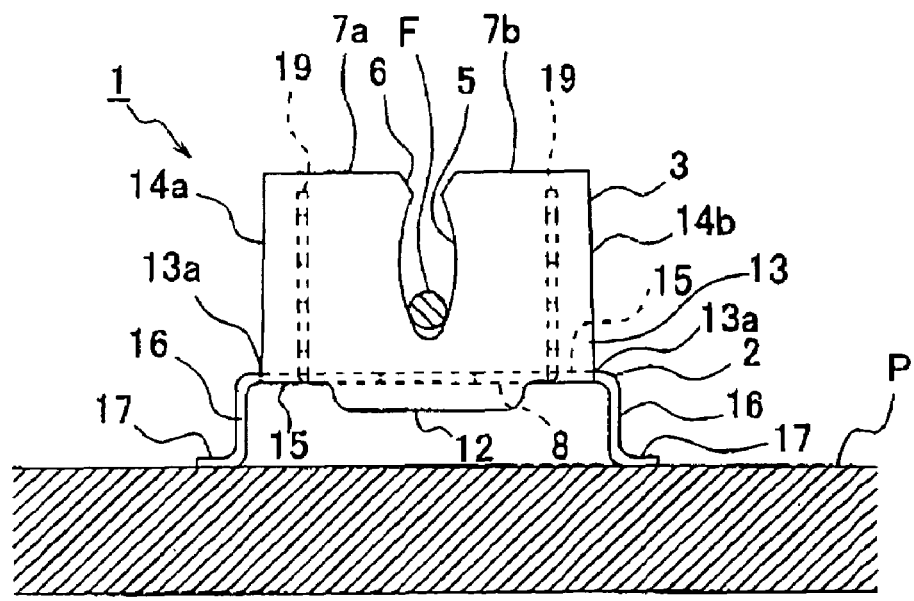
FIG. 3A is an explanatory view illustrating a state of the clamp of Embodiment 1 in use that has an optical fiber inserted therethrough after being surface mounted.

As shown in FIG. 3A, the clamp 1 is surface mounted by soldering the fixing portions 17 on a printed circuit board P (solder is not shown). When the clamp 1 is surface mounted, the excessive deformation preventing portion 12 does not contact the printed circuit board P. Automatic mounting may be performed by means of suctioning the upper surface 7a or the upper surface 7b of the flexible synthetic resin member 3 using nozzle-suction, and of reflow soldering. That is, the upper surface 7a and the upper surface 7b may be used as nozzle suction surfaces during automatic mounting.

As shown in FIG. 3A, the clamp 1 surface mounted on the printed circuit board P is not deformed (i.e., having a shape shown in FIGS. 1A through 1C and 2). In this state, an optical fiber F (a slender member) is inserted from the opening 6 into the clamp groove 5.

When the upper surfaces 7a and 7b of the flexible synthetic resin member 3 are pressed, for example, by a finger, the pinching portions 14a and 14b and the base portion 13 are pressed to apply a pressing force in a direction so as to bring the excessive deformation preventing portion 12 closer to the printed circuit board P. Then, the pressing force acting on the metal plate member 2 deforms the deformation allowing portion 8 so as to become closer to the printed circuit board P.

Since each of the legs 16 supports one end of each of the extending portions 15, the deformation allowing portion 8 is deformed as a whole into an arcuate shape such that a central portion thereof (around the through hole 9) is closest to the printed circuit board P. In this case, amounts of deformation of the extending portions 15 are relatively large since a width (a dimension in upper and lower directions in FIG. 1A) of each of the extending portions 15 is small compared with the remaining part of the deformation allowing portion 8.

Since a distance between a lower end 13a of the base portion 13 and the legs 16 is small, the lower end 13a of the base portion 13 is supported by corner portions of the legs 16 and the extending portions 15. As a result, the above described pressing force deforms the base portion 13 and the pinching portions 14a and 14b such that the pinching portions 14a and 14b lean toward the clamp groove 5.

When the excessive deformation preventing portion 12 contacts the printed circuit board P due to the above described pressing force, the excessive deformation preventing portion 12 supports the deformation allowing portion 8. Then, the deformation allowing portion 8 cannot be deformed easily. This prevents excessive deformation of the deformation allowing portion 8 and the flexible synthetic resin member 3.

Specifically, although the excessive deformation preventing portion 12 itself is deformed to some extent when contacting the printed circuit board P, the excessive deformation preventing portion 12 can prevent further deformation of the base portion 13, or of the base portion 13 and the shape preservation members 19 during or after the insertion of the optical fiber F. If the excessive deformation preventing portion 12 is not provided, the upper surfaces 7a and 7b of the clamp 1 will strike against each other, and thereby the shape preservation members 19 are likely to be bent in undesirable directions, i.e., in both outward directions of the pinching portions 14a and 14b. In this case, a fixed state of the clamp 1 as intended by the inventor of the present invention (FIG. 3B) may not be achieved.

Due to the deformation of the base portion 13 and the pinching portions 14a and 14b, and the deformation of the deformation allowing portion 8 to be convex toward the printed circuit board P, a width of the clamp groove 5 is narrowed, and the opening 6 is closed. The shape preservation members 19 positioned across the clamp groove 5 from each other are also deformed such that a distance between opposing top ends of the shape preservation members 19 will be reduced.

The metal plate member 2 having little or no spring properties remains deformed as described above, even after the above pressing force is released. Accordingly, the flexible synthetic resin member 3 also remains deformed as described above.

Figure 3B:
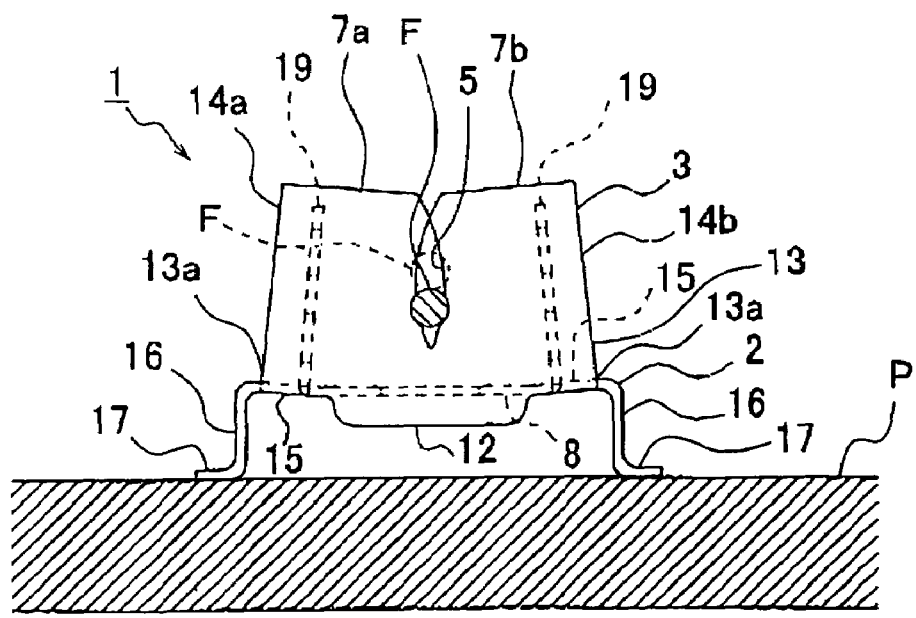
FIG. 3B is an explanatory view illustrating a state of the clamp of Embodiment 1 in use that is deformed so as to pinch the optical fiber.
Figure 4B:
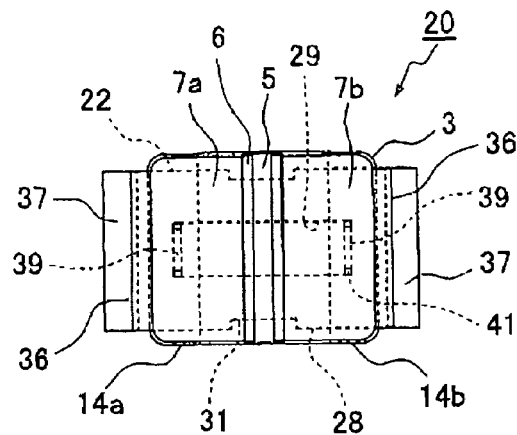
FIGS. 4A through 4E are a front elevational view, a plan view, a left side elevational view, a bottom view and a right side elevational view, respectively, showing a clamp of Embodiment 2.
Figure 4C:
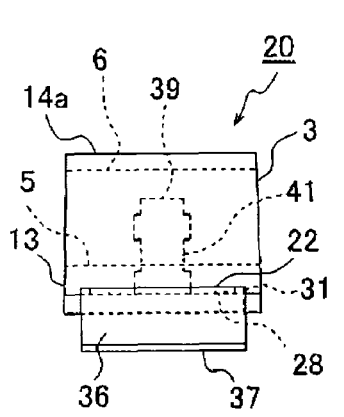
Figure 4A:
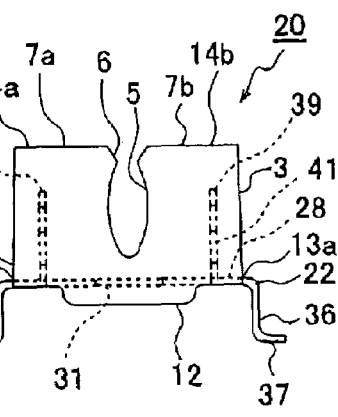
Figure 4E:
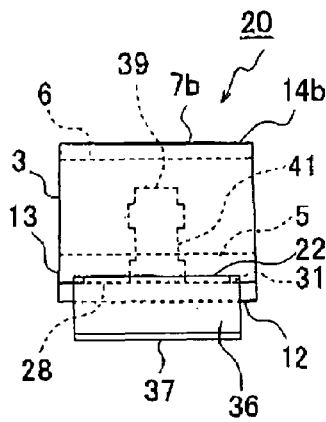
Figure 4D:
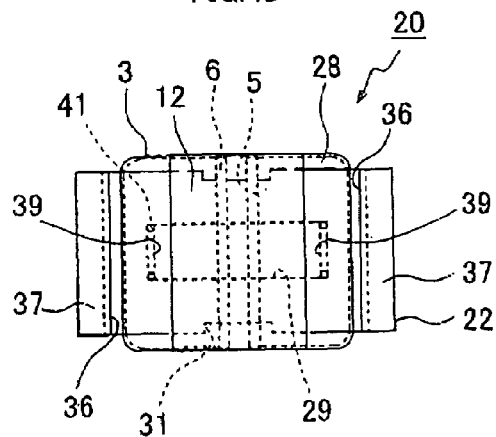

Thus, the optical fiber F is pinched and held by the inner wall surfaces of the clamp groove 5 as shown in FIG. 3B. The optical fiber F, therefore, is unlikely to be displaced both in an axial direction and in a radial direction. Also, the optical fiber F is unlikely to come out of the clamp groove 5 even when a large force is applied, since the opening 6 is closed.

Furthermore, the clamp 1, which can be automatically mounted as described above, does not require a manual fitting onto the printed circuit board P, or provision of an attachment hole in the printed circuit board P.

The clamp groove 5 for holding the optical fiber F is provided in the flexible synthetic resin member 3. Accordingly, the covering of the optical fiber F is unlikely to be damaged at a time of inserting the optical fiber F into the clamp groove 5, at a time of pressing the clamp 1 after the insertion, or at a time of vibration after the optical fiber F is held.

Since the optical fiber F is inserted into the clamp groove 5 before deforming the clamp 1, the reaction force at the time of insertion is small. Accordingly an excessive force, which may cause distortion of the optical fiber F and thereby attenuation of a signal, can be prevented from being exerted on the optical fiber F.

Since the optical fiber F is inserted into the clamp groove 5 before deforming the clamp 1, the above described advantage can surely be achieved even when the flexible synthetic resin member 3 is made of a material having a non-smooth surface, such as elastomer or gel.

Furthermore, the configuration of pinching the optical fiber F with the clamp groove 5 of the flexible synthetic resin member 3 may be applied to optical fibers having various fiber diameters. In addition, a plurality of optical fibers may be clamped all together, as indicated by a dashed line in FIG. 3B. In this case, the plurality of optical fibers may have different fiber diameters. In brief, a variety of objects can be clamped using the present clamp 1.

While the clamp 1 is deformed by pressing from above as described in the present embodiment, the clamp 1 may be deformed as shown in FIG. 3B by applying a force to pinch the clamp 1 from both the left and right directions in FIG. 3A. Also in this case, the same operation and advantages as described in the present embodiment can be achieved.

Figure 12A:
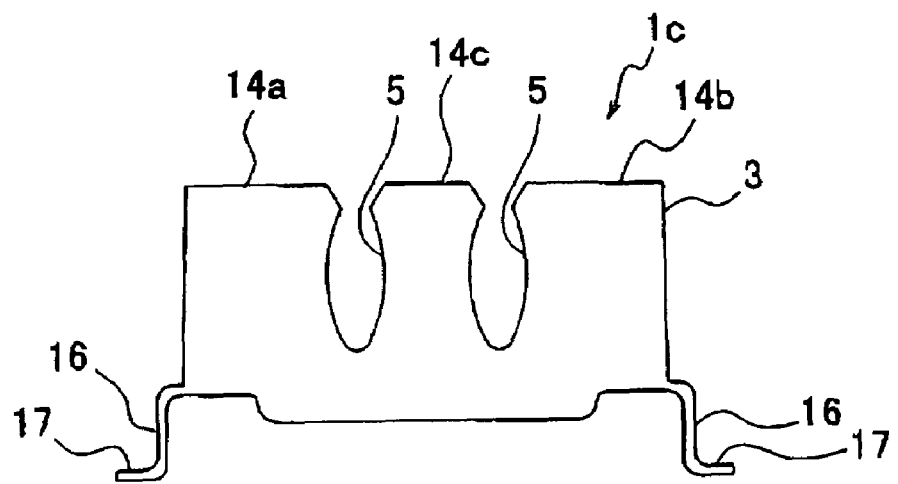
FIGS. 12A and 12B are schematic views each showing a clamp with three or more pinching portions.
Figure 12B:
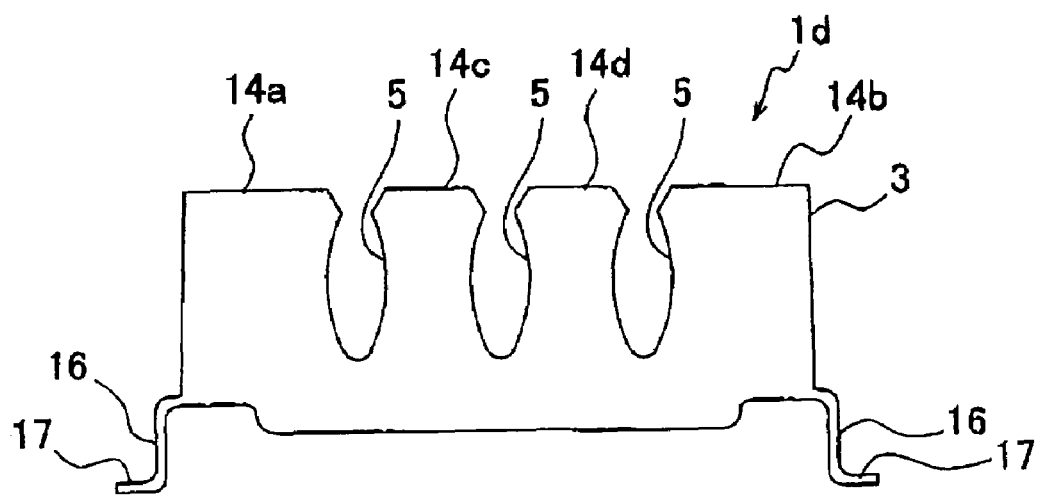

The number of the pinching portions is not limited to two. There may be three pinching portions 14a, 14b and 14c as shown in FIG. 12A, four pinching portions 14a, 14b, 14c and 14d as shown in FIG. 12B, or more number of pinching portions.

Embodiment 2

While the clamp 1 is provided with two legs 16 on each side of the clamp groove 5, i.e., four legs 16 in total in Embodiment 1, a configuration with one leg on each side of the clamp groove 5 may be possible. An example of such a configuration will now be described as Embodiment 2. Since the flexible synthetic resin member 3 is the same as in Embodiment 1, the same reference numerals are used without any explanation.

As shown in FIGS. 4A-4E, a clamp 20 in the present embodiment includes a deformation allowing portion 28 of a metal plate member 22 (a tough pitch copper plate having a thickness of 0.2 mm which is the same as in Embodiment 1), provided with a rectangular through hole 29 and cutouts 31. The through hole 29 is formed by cutting and erecting the shape preservation member 39.

The base portion 13 and the excessive deformation preventing portion 12 of the flexible synthetic resin member 3 connect with each other through the through hole 29 and the cutouts 31.

Legs 36 extend respectively from two opposite sides, with the clamp groove 5 located therebetween, of the deformation allowing portion 28 of the metal plate member 22. Fixing portions 37 which are integrally joined to the legs 36, respectively, are used for attachment of the clamp 20 to a plate member, such as a printed circuit board.

The deformation allowing portion 28 constitutes a flat plate, while the legs 36 are bent to be substantially perpendicular to the deformation allowing portion 28, and the fixing portions 37 are bent to be substantially perpendicular to the legs 36.

A pair of shape preservation members 39 are erected from the deformation allowing portion 28. The shape preservation members 39 are arranged to face each other across the clamp groove 5 located therebetween. Each of the shape preservation members 39 is formed such that a portion is cut and bent from an end of the through hole 29 erected substantially perpendicular to the deformation allowing portion 28.

The shape preservation members 39 are entirely covered by the base portion 13 and the pinching portions 14a and 14b of the flexible synthetic resin member 3. In other words, each of the pinching portions 14a and 14b is a pinching portion including a frame. Longitudinal sides of each of the shape preservation members 39 are provided with cutouts 41, thereby having concaves and convexes which engage with the flexible synthetic resin member 3.

The clamp 20 is surface mounted by soldering the fixing portions 37 on a printed circuit board P in the same manner as in the clamp 1 of Embodiment 1 (not particularly shown, see FIG. 3A) In this case, it may be possible to perform automatic mounting and reflow soldering by using the upper surfaces 7a and 7b as nozzle suction surfaces. When the clamp 20 is surface mounted, the excessive deformation preventing portion 12 does not contact the printed circuit board P.

The procedure of making the clamp 20, which is surface mounted on the printed circuit board P, pinch a slender member, such as an optical fiber F, is the same as in Embodiment 1.

Specifically, after the clamp 20 is surface mounted on the printed circuit board P, an optical fiber F (a slender member) is first inserted from the opening 6 into the clamp groove 5. Then the upper surfaces 7a and 7b of the flexible synthetic resin member 3 are pressed, for example, by a finger, and thereby the pinching portions 14a and 14b and the base portion 13 are applied a pressing force to be deformed so as to bring the deformation allowing portion 28 closer to the printed circuit board P.

Since the legs 36 support both ends of the deformation allowing portion 28, the deformation allowing portion 28 is deformed as a whole into an arcuate shape such that a central portion thereof is closest to the printed circuit board P.

Since the lower end 13a of the base portion 13 is supported by corner portions of the deformation allowing portion 28 and the legs 36, the above described pressing force deforms the base portion 13 and the pinching portions 14a and 14b such that the pinching portions 14a and 14b lean toward the clamp groove 5.

When the excessive deformation preventing portion 12 contacts the printed circuit board P due to the above described pressing force, further deformation of the deformation allowing portion 28 and the flexible synthetic resin member 3 is not allowed. Thus, excessive deformation can be prevented.

Specifically, although the excessive deformation preventing portion 12 itself is deformed to some extent when contacting the printed circuit board P, the excessive deformation preventing portion 12 can prevent further deformation of the base portion 13, or of the base portion 13 and the shape preservation members 39 during or after the insertion of the optical fiber F. If the excessive deformation preventing portion 12 is not provided, the upper surfaces 7a and 7b of the clamp 20 will strike against each other, and thereby the shape preservation members 39 are likely to be bent in undesirable directions, i.e., in both outward directions of the pinching portions 14a and 14b. In this case, a fixed state of the clamp 20 as intended by the inventor of the present invention (see FIG. 3B) may not be achieved.

Due to the deformation of the base portion 13 and the pinching portions 14a and 14b, and the deformation of the deformation allowing portion 28 to be convex toward the printed circuit board P, a width of the clamp groove 5 is narrowed, and the opening 6 is closed. The shape preservation members 39 positioned across the clamp groove 5 from each other are also deformed such that a distance between opposing top ends of the shape preservation members 39 will be reduced.

The metal plate member 22 having little or no spring properties remains deformed as described above, even after the above pressing force is released. Accordingly, the flexible synthetic resin member 3 also remains deformed as described above.

Thus, the optical fiber F is pinched and held by inner wall surfaces of the clamp groove 5 (see FIG. 3B), and therefore is unlikely to be displaced both in an axial direction and in a radial direction. Also, the optical fiber F is unlikely to come out of the clamp groove 5 even when a large force is applied, since the opening 6 is closed.

Furthermore, the clamp 20, which can be automatically mounted as described above, does not require a manual fitting into the printed circuit board P, or provision of an attachment hole in the printed circuit board P.

The clamp groove 5 for holding the optical fiber F is provided in the flexible synthetic resin member 3. Accordingly, the covering of the optical fiber F is unlikely to be damaged at a time of inserting the optical fiber F into the clamp groove 5, at a time of pressing the clamp 20 after the insertion, or at a time of vibration after the optical fiber F is held.

Since the optical fiber F is inserted into the clamp groove 5 before deforming the clamp 20, the reaction force at the time of insertion is small. Accordingly, an excessive force, which may cause distortion of the optical fiber F and thereby attenuation of a signal, can be prevented from being exerted on the optical fiber F.

Since the optical fiber F is inserted into the clamp groove 5 before deforming the clamp 20, the above described advantage can surely be achieved even when the flexible synthetic resin member 3 is made of a material having a non-smooth surface, such as elastomer or gel.

Furthermore, the configuration of pinching the optical fiber F with the clamp groove 5 of the flexible synthetic resin member 3 may be applied to optical fibers having various fiber diameters. In addition, a plurality of optical fibers may be clamped all together. In this case, the plurality of optical fibers may have different fiber diameters. In brief, a variety of objects can be clamped using the present clamp 20.

A major difference between the clamp 20 and the clamp 1 in Embodiment 1 is that the clamp 20 has only two legs 36. The legs 36 provide a greater strength, since there is no cut area which is provided between two sets of the extending portions 15 and the legs 16 on one side of the clamp groove 5 in Embodiment 1. In other words, each extending portion extends along the length of one side of the deformation allowing portion 28, and each of the legs 36 extends along the length of the extending portion. The clamp 20 may be deformed by applying a force to pinch the clamp 20 from both the left and right directions in FIG. 4A in the same manner as described in Embodiment 1.

Embodiment 3

While one shape preservation member is provided on each side of the clamp groove 5 in Embodiment 1 and Embodiment 2, a configuration with one shape preservation member only on one side of the clamp groove 5 may be possible. An example of such a configuration will now be described as Embodiment 3. The materials of the metal plate member and the flexible synthetic resin member are the same as in Embodiment 1. Also, most elements, which are the same as the elements in Embodiment 1, are assigned the same reference numerals without particular explanation.

As shown in FIG. 5, a clamp 1a of the present embodiment is provided with a shape preservation portion 19 included in the pinching portion 14b and without any shape preservation member in the pinching portion 14a. That is, only the pinching portion 14b is a pinching portion including a frame.

The procedure of surface mounting the clamp 1a and the procedure of making the clamp 1a, which is surface mounted on the printed circuit board P, pinch a slender member, such as an optical fiber F, are the same as in Embodiment 1.

Specifically, after the clamp 1a is surface mounted on the printed circuit board P, an optical fiber F (a slender member) is first inserted from the opening 6 into the clamp groove 5. Then, the upper surfaces 7a and 7b of the flexible synthetic resin member 3 are pressed, for example, by a finger, and the pinching portions 14a and 14b and the base portion 13 are applied a pressing force to be deformed so as to bring the deformation allowing portion 8 closer to the printed circuit board P.

Since each of the legs 16 supports each end of the deformation allowing portion 8, the deformation allowing portion 8 is deformed as a whole into an arcuate shape such that a central portion thereof is closest to the printed circuit board P.

Since a distance between a lower end 13a of the base portion 13 and the legs 16 is small, the lower end 13a of the base portion 13 is supported by corner portions of the legs 16 and the extending portions 15. As a result, the above described pressing force deforms the base portion 13 and the pinching portions 14a and 14b such that the pinching portions 14a and 14b lean toward the clamp groove 5.

When the excessive deformation preventing portion 12 contacts the printed circuit board P due to the above described pressing force, further deformation of the deformation allowing portion 8 and the flexible synthetic resin member 3 is not allowed. Thus, excessive deformation can be prevented.

Specifically, although the excessive deformation preventing portion 12 itself is deformed to some extent when contacting the printed circuit board P, the excessive deformation preventing portion 12 can prevent further deformation of the base portion 13, or the base portion 13 and the shape preservation member 19 during or after the insertion of the optical fiber F. If the excessive deformation preventing portion 12 is not provided, the upper surfaces 7a and 7b of the clamp 1 will strike against each other, and thereby the shape preservation member 19 is likely to be bent in an undesirable direction, i.e., in an outward direction of the pinching portion 14b. In this case, a fixed state of the clamp 1a as intended by the inventor of the present invention (FIG. 3B) may not be achieved.

Due to the deformation of the base portion 13 and the pinching portions 14a and 14b, and the deformation of the deformation allowing portion 8 to be convex toward the printed circuit board P, a width of the clamp groove 5 is narrowed, and the opening 6 is closed. The shape preservation member 19 is also deformed in accordance with the pinching portion 14b.

The metal plate member 2 having little or no spring properties remains deformed as described above, even after the above pressing force is released. Accordingly, the flexible synthetic resin member 3 also remains deformed as described above. Although the pinching portion 14a does not include a shape preservation member therein, recovery from the deformation of the pinching portion 14a is prevented by the deformation of the deformation allowing portion 8.

Thus, the optical fiber F is pinched and held by inner wall surfaces of the clamp groove 5 (see FIG. 3B), and therefore is unlikely to be displaced both in an axial direction and in a radial direction. Also, the optical fiber F is unlikely to come out of the clamp groove 5 even when a large force is applied, since the opening 6 is closed.

Furthermore, the clamp 1a, which can be automatically mounted as described above, does not require a manual fitting into the printed circuit board P, or provision of an attachment hole in the printed circuit board P.

The clamp groove 5 for holding the optical fiber F is provided in the flexible synthetic resin member 3. Accordingly, the covering of the optical fiber F is unlikely to be damaged at the time of inserting the optical fiber F into the clamp groove 5, of pressing the clamp 1a after the insertion, or of vibration after the optical fiber F is held.

Since the optical fiber F is inserted into the clamp groove 5 before deforming the clamp 1a, a reaction force at the time of insertion is small. Accordingly, excessive force, which may cause distortion of the optical fiber F and thereby attenuation of a signal, can be prevented from being exerted on the optical fiber F.

Since the optical fiber F is inserted into the clamp groove 5 before deforming the clamp 1a, the above described advantage can surely be achieved even when the flexible synthetic resin member 3 is made of a material having a non-smooth surface, such as elastomer or gel.

Furthermore, the configuration of pinching the optical fiber F with the clamp groove 5 of the flexible synthetic resin member 3 may be applied to optical fibers having various fiber diameters. In addition, a plurality of optical fibers may be clamped all together. In this case, the plurality of optical fibers may have different fiber diameters. In brief, a variety of objects can be clamped using the present clamp 1a.

The clamp 1a may be deformed by applying a force to pinch the clamp 1a from both the left and right directions in FIG. 5A in the same manner as described in Embodiment 1.

Also, a configuration with a shape preservation member provided only on one side of the clamp groove 5 may be applied to the clamp 20 in Embodiment 2.

Embodiment 4

While the fixing portions 17 or 37 extend outward from the legs 16 or 36 in Embodiments 1, 2, and 3, fixing portions may extend in opposite directions. That is, fixing portions may be arranged under the deformation allowing portion 8 or 28. An example of such a configuration will now be described as Embodiment 4. The materials of the metal plate member and the synthetic resin member are the same as in Embodiment 1. Also, most elements are the same as the elements in Embodiment 1, and therefore are assigned the same reference numerals without particular explanation.

In a clamp 1b of the present embodiment, as shown in FIG. 6, one fixing member 47 is connected to each two legs 16 located on each side of the clamp 1b with respect to the clamp groove 5. Both of the fixing members 47 extend under the deformation allowing portion 8 and the excessive deformation preventing portion 12.

Figure 7:
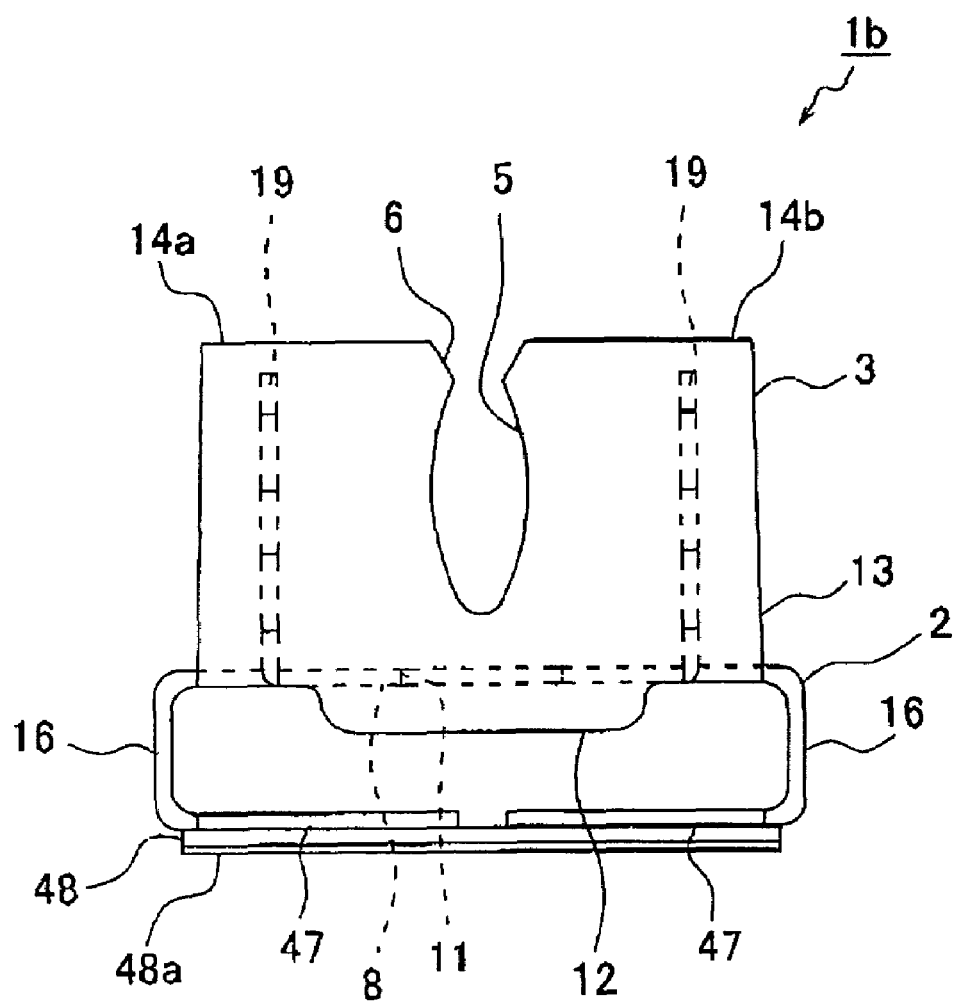
FIG. 7 is a front elevational view showing the clamp of Embodiment 4 with double-sided tape applied thereto.

As shown in FIG. 7, double-sided tape 48 is applied to the fixing portions 47 of the clamp 1b. Once a release paper 48a of the double-sided tape 48 is removed, the fixing portion 47 and thus the clamp 1b can be fixedly attached to a plate member, such as a printed circuit board. This allows attachment of the clamp 1b to a plate member made of a material unsuitable for soldering or at a position having a difficulty in soldering. Alternatively, the fixing portions 47 may be attached by soldering in the same manner as in Embodiments 1, 2 and 3 instead of applying the double-sided tape.

The procedure of making the clamp 1b pinch a slender member, such as an optical fiber F, is the same as in Embodiment 1. Also, the operation and advantages of the clamp 1b are the same as in Embodiment 1, except for a manner of fixedly attaching the clamp 1b to the plate member. Therefore, any particular explanation will not be provided here.

The structure of the fixing portion 47 and the double-sided tape 48 described in connection with the present embodiment may be applied to the clamp 20 in Embodiment 2 and the clamp 1a in Embodiment 3.

Embodiment 5

As shown in FIGS. 8A through 8E, a clamp 51 of the present embodiment includes a metal plate member 52 and a flexible synthetic resin member 53.

The metal plate member 52 is produced by pressing a metal plate with little or no spring properties and capable of being soldered. A tough pitch copper plate (JIS (Japanese Industrial Standard) H3100 C1100R) having a thickness of 0.2 mm is employed in the present embodiment.

The flexible synthetic resin member 53 is formed of flexible synthetic resin. Silicone having a hardness of 40 degrees as measured with a Type A durometer (JIS K6253) is employed in the present embodiment. The hardness of 40 degrees as measured with a Type A durometer (JIS K6253) corresponds to a hardness of 20-30 as measured with a Type B durometer (ASTM D2240). However, correspondence between the two types of hardness is variable depending on various conditions, such as the composition of a sample, vulcanizing conditions, the resulting viscoelasticity, the dimension, the shape, and the temperature during measurement, rather than being fixed. Therefore, the degree of hardness should be used only an indication for comparison purposes.

The flexible synthetic resin member 53, having an L-shaped configuration as shown in FIG. 8A, includes a horizontal part as a base portion 63 and a vertical part as a pinching portion 64. An upper surface 57 of the base portion 63 is a substantially flat surface.

Since a deformation allowing portion 58 of the metal plate member 52 penetrates the base portion 63, the base portion 63 is divided into an upper side portion and a lower side portion with respect to the deformation allowing portion 58. However, the upper side portion and the lower side portion connect with each other through a through hole 59 and a cutout 61 provided in the deformation allowing portion 58. An excessive deformation preventing portion 62 is integrally joined to the lower side portion.

The deformation allowing portion 58, having a flat configuration, includes ends protruding from the base portion 63 and legs 66 extending from the ends. A fixing portion 67 is integrally joined to each of the legs 66.

While the deformation allowing portion 58 has a flat configuration, the legs 66 are bent aslant to provide an angle of 135 degrees with the deformation allowing portion 58. The fixing portion 67 is bent aslant to provide an angle of 135 degrees with each of the legs 66, and the deformation allowing portion 58 and the fixing portion 67 are substantially parallel with each other. The fixing portion 67 is used for fixing the clamp 1b to a plate member, such as a printed circuit board.

A shape preservation member 69 is erected from the deformation allowing portion 58 in a direction opposite to the legs 66 and the fixing portions 67. The shape preservation member 69, erected substantially perpendicular to the deformation allowing portion 58, is covered by the pinching portion 64. In brief, the pinching portion 64 is a pinching portion with a frame therein.

Longitudinal sides of the shape preservation members 69 include cutouts 71, thereby having concaves and convexes which engage with the flexible synthetic resin member 53.

The clamp 51 is surface mounted by soldering the fixing portions 67 on a printed circuit board P (see FIG. 9) in the same manner as the clamp 1 in Embodiment 1. When the clamp 51 is surface mounted, the excessive deformation preventing portion 62 does not contact the printed circuit board P. Automatic mounting may be performed by means of suctioning the upper surface 57 of the base portion 63 using a nozzle, and of reflow soldering. That is, the upper surface 57 may be used as a nozzle suction surface during automatic mounting.

Figure 9:
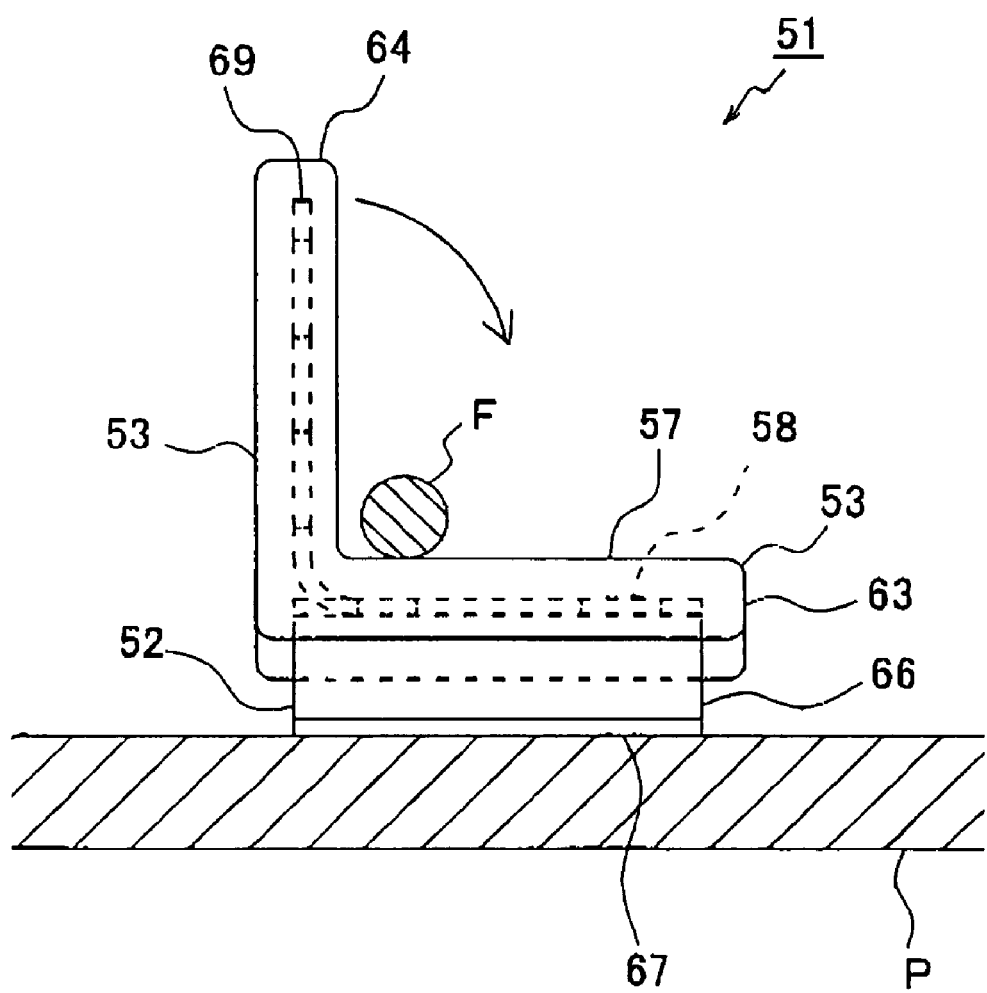
FIG. 9 is an explanatory view illustrating a state of the clamp of Embodiment 5 which is surface mounted on a printed substrate and holds an optical fiber thereon.

As shown in FIG. 9, the clamp 61 surface mounted on the printed circuit board P is not deformed. In this state, an optical fiber F (a slender member) is placed on the upper surface 57 of the base portion 63.

Subsequently, a pressing force is applied to the pinching portion 64, for example, by a finger so as to fold down the pinching portion 64 on the base portion 63. Then, the optical fiber F is held between the pinching portion 64 and the base portion 63. Even when the pressing force applied to the pinching portion 64 is excessively large, downward displacement of the base portion 63 is stopped once the excessive deformation preventing portion 62 contacts the printed circuit board P. Thus, excessive deformation can be prevented.

Since the legs 66 support both ends the deformation allowing portion 58, the deformation allowing portion 58 is deformed as a whole into an arcuate shape such that a central portion thereof (around the through hole 59) is closest to the printed circuit board P. As a result, the optical fiber F held between the pinching portion 64 and the base portion 63 is deformed into a slightly arcuate shape.

The metal plate member 52 having little or no spring properties remains deformed as described above, even after the above pressing force is released. Accordingly, the flexible synthetic resin member 53 also remains deformed as described above.

Thus, the optical fiber F is pinched and held by the pinching portion 64 and the base portion 63, and therefore is unlikely to be displaced both in an axial direction and in a radial direction. Also, the optical fiber F is unlikely to come out even when a large force is applied. The above described deformation of the optical fiber F into a slightly arcuate shape may prevent the optical fiber F from being displaced or coming out.

Furthermore, the clamp 51, which can be automatically mounted as described above, does not require a manual fitting into the printed circuit board P, or provision of an attachment hole in the printed circuit board P.

Since the optical fiber F is pinched by the flexible synthetic resin member 53, the covering of the optical fiber F is unlikely to be damaged at the time of applying a pressing force to pinch the optical fiber F, or at the time of vibration after the optical fiber F is held.

Since the pinching portion 64 is folded down after the optical fiber F is placed on the base portion 63, an excessive force, which may cause distortion of the optical fiber F and thereby attenuation of a signal, can be prevented from being exerted on the optical fiber F.

Since the pinching portion 64 is folded down after the optical fiber F is placed on the base portion 63, the above advantage can surely be achieved even when the flexible synthetic resin member 53 is made of a material having a non-smooth surface, such as elastomer or gel.

Furthermore, the configuration of pinching the optical fiber F with the pinching portion 64 and the base portion 63 may be applied to optical fibers having various fiber diameters. In addition, a plurality of optical fibers may be clamped all together. In this case, the plurality of optical fibers may have different fiber diameters. In brief, a variety of objects can be clamped using the present clamp 51.

The structure of the fixing portion 47 and the double-sided tape 48 described in connection with Embodiment 4 may be applied to the clamp 51 in Embodiment 5.

Embodiment 6

While the upper surface 57 of the base portion 63 is a flat surface in the clamp 51 of Embodiment 5, a depression provided in the upper surface 57 will hold a slender member in a stable pinching position. An example of such a configuration will now be described as Embodiment 6. Elements and structures other than the configuration of an upper surface of the base portion 63 are the same as in Embodiment 5, and, therefore, will be assigned the same reference numerals and will not be particularly explained.

In a clamp 51a of the present embodiment, as shown in FIG. 10A, three groove-like depressions 57a, each having an arcuate cross section, are provided in an upper surface of the base portion 63. Accordingly, when optical fibers F (slender members) are placed on the base portion 63, the optical fibers F are received by the groove-like depressions 57a and stabilized, as indicated by the two-dot chain lines in FIG. 10A. Therefore, when the pinching portion 64 is folded down so as to pinch the optical fibers F as described in Embodiment 5, the optical fibers F are held in a stable pinching position.

The procedure of making the clamp 51a pinch a slender member, such as an optical fiber F, is the same as in Embodiment 5. Also, the operation and advantages of the clamp 51a are the same as in Embodiment 5, other than matters concerning the groove-like depression 57a. Therefore, any particular explanation will not be provided here.

The structure of the fixing portion 47 and the double-sided tape 48 described in connection with Embodiment 4 may be applied to the clamp 51a in Embodiment 6.

Embodiment 7

While the groove-like depressions 57a in the base portion 63 are relatively shallow depressions, each having an arcuate cross section, in the clamp 51a of Embodiment 6, the depressions may be further deep. An example of such a configuration will now be described as Embodiment 7. Elements and the structures other than the configuration of the grove-like depression in the base portion 63 are the same as in Embodiments 5 and 6, and, therefore, will be assigned the same reference numerals and will not be particularly explained In a clamp 51b of the present embodiment, as shown in FIG. 11A, three groove-like depressions 57b, each having a U-shaped cross section, are provided in an upper surface of the base portion 63. Accordingly, when optical fibers F (slender members) are placed on the base portion 63, the optical fibers F are received by the groove-like depressions 57b. Therefore, when the pinching portion 64 is folded down so as to pinch the optical fibers F as described in Embodiment 5, the optical fibers F are held in a stable pinching position.

The procedure of making the clamp 51b pinch a slender member, such as an optical fiber F, is the same as in Embodiment 5. Also, the operation and advantages of the clamp 51b are the same as in Embodiment 5, other than matters concerning the groove-like depression 57b. Therefore, any particular explanation will not be provided here.

The structure of the fixing portion 47 and the double-sided tape 48 described in connection with Embodiment 4 may be applied to the clamp 51b in Embodiment 7.

In Embodiments 1 through 7, the excessive deformation preventing portion and the plate member do not contact each other when the clamp is fixed to the printed circuit board as the plate member by means of soldering or double-sided tape. However, the excessive deformation preventing portion may contact the plate member when the clamp is fixed to the plate member. In this case, the clamp may be deformed by applying a force from a transverse direction or an upper direction. When the force is applied from the upper direction, the excessive deformation preventing portion is expanded in a transverse direction, thereby causing the deformation allowing portion to be deformed so as to be convex downward.

Although preferred embodiments of the present invention have been described as above, the present invention is not to be limited to the above specific embodiments, but may be practiced in various forms within the scope not departing from the gist of the present invention.

What is claimed is:

1. A clamp to be fixed to a plate member for holding a slender member, the clamp comprising:
   a metal plate capable of bending deformation and soldering thereof; and
   a flexible synthetic resin member held by the metal plate, the metal plate including:
      a leg used to attach the clamp to the plate member;
      a deformation allowing portion having at least one of a through hole and a cutout, the deformation allowing portion being held by the leg so as to face the plate member;
      a shape preservation member erected from the deformation allowing portion on an opposite side to the leg,
   the flexible synthetic resin member including:
      a base portion that covers at least a portion of one surface of the deformation allowing portion on a side of the shape preservation member;
      at least one pinching portion that pinches the slender member, the at least one pinching portion being integrally joined to the base portion and including at least one pinching portion with a frame encompassing a part or an entirety of the shape preservation member; and an excessive deformation preventing portion arranged opposite to the base portion with the deformation allowing portion located therebetween, the excessive deformation preventing portion connecting with the base portion through the at least one of the through hole and the cutout, wherein when the clamp is deformed so as to pinch the slender member between the at least one pinching portion with the frame and another one of the at least one pinching portion, or between the at least one pinching portion with the frame and a portion of the flexible synthetic resin member other than the at least one pinching portion, the shape preservation member encompassed by the at least one pinching portion with the frame is accordingly deformed, and wherein the at least one pinching portion with the frame and the shape preservation member remain deformed, even after a force applied to deform the at least one pinching portion with the frame is released.

2. The clamp according to claim 1,
wherein the at least one pinching portion includes two pinching portions located to face each other,
and wherein a clamp groove for passing the slender member therethrough is formed between the two pinching portions.

3. The clamp according to claim 2, wherein each of the two pinching portions is the pinching portion with the frame.

4. The clamp according to claim 2, wherein only one of the two pinching portions is the pinching portion with the frame.

5. The clamp according to claim 1,
wherein the at least one pinching portion with the frame is one pinching portion with a frame,
and wherein the slender member is pinched between the pinching portion with the frame and the base portion.

6. The clamp according to claim 5, wherein the base portion includes at least one recess that stably holds the slender member.

7. The clamp according to claim 1, wherein the shape preservation member before being deformed forms one of substantially a right angle and an acute angle on a side of pinching the slender member with the deformation allowing portion.

8. The clamp according to claim 7, wherein the shape preservation member is formed by making a cut in a part of the metal plate for forming a through hole in the metal plate, and by bending a portion defined by the cut.

9. The clamp according to claim 1,
wherein the deformation allowing portion is provided with an extending portion,
and wherein the leg extends from the extending portion.

10. The clamp according to claim 9,
wherein the extending portion extends along the length of one side of the deformation allowing portion,
and wherein the leg extends along the length of the extending portion.

11. The clamp according to claim 1, wherein a fixing portion is integrally joined to an end of the leg, the fixing portion including a flat surface facing the plate member.

12. The clamp according to claim 1, wherein the leg is soldered to the plate member.

13. The clamp according to claim 8, wherein the fixing portion is soldered to the plate member.

14. The clamp according to claim 8, wherein double-sided tape is applied to the fixing portion.

* * * * *